United States Patent
Lee et al.

(10) Patent No.: US 7,889,570 B2
(45) Date of Patent: Feb. 15, 2011

(54) MEMORY DEVICE INPUT BUFFER, RELATED MEMORY DEVICE, CONTROLLER AND SYSTEM

(75) Inventors: Dong-woo Lee, Suwon-si (KR);
Jung-yong Choi, Seongnam-si (KR);
Jong-hyun Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1183 days.

(21) Appl. No.: 11/515,799

(22) Filed: Sep. 6, 2006

(65) Prior Publication Data

US 2007/0070782 A1    Mar. 29, 2007

(30) Foreign Application Priority Data

Sep. 10, 2005  (KR) .................... 10-2005-0084425

(51) Int. Cl.
*G11C 7/10* (2006.01)
(52) U.S. Cl. .................. 365/189.05; 365/230.06; 365/230.08; 365/233.5
(58) Field of Classification Search ............ 365/189.05, 365/230.06, 230.08, 233.5, 233.1, 194
See application file for complete search history.

(56) References Cited

U.S. PATENT DOCUMENTS 5,986,943 A    11/1999  Isa

| 6,075,749 | A  | * | 6/2000 | Isa .................. 365/233.11 |
| 6,192,429 | B1 |   | 2/2001 | Jeong et al. |
| 6,356,489 | B2 | * | 3/2002 | Lee ....................... 365/198 |
| 6,510,099 | B1 |   | 1/2003 | Wilcox et al. |
| 6,734,802 | B2 |   | 5/2004 | Halleck et al. |
| 6,744,687 | B2 |   | 6/2004 | Koo et al. |

FOREIGN PATENT DOCUMENTS

| JP | 2001-160288   | 6/2001  |
| JP | 2002-076878   | 3/2002  |
| KR | 1019950002025 | 3/1995  |
| KR | 101998014086  | 5/1998  |
| KR | 1020020095686 | 12/2002 |
| TW | 86117088      | 11/1986 |
| TW | 92206604      | 4/1992  |

\* cited by examiner

*Primary Examiner*—Tuan T Nguyen
*Assistant Examiner*—Toan Le
(74) *Attorney, Agent, or Firm*—Volentine & Whitt, PLLC

(57) ABSTRACT

Provided are an input buffer of a memory device, a memory controller, and a memory system making use thereof. The input buffer of a memory device is enabled or disabled in response to a first signal showing chip selection information and a second signal showing power down information, and the input buffer is enabled only when the second signal shows a non-power down mode and the first signal shows a chip selection state. The input buffer is at least one selected from the group consisting of a row address strobe input buffer, a column address strobe input buffer, and an address input buffer.

22 Claims, 6 Drawing Sheets

MEMORY DEVICE INPUT BUFFER, RELATED MEMORY DEVICE, CONTROLLER AND SYSTEM

BACKGROUND OF THE INVENTION

1. Field of the Invention

Embodiments of the invention relate generally to memory devices. More particularly, embodiments of the invention relate to a memory device input buffer, memory devices incorporating said input buffer, a memory controller adapted for use with such memory device, and a related memory system.

A claim of priority is made to Korean Patent Application No. 10-2005-0084425, filed on Sep. 10, 2005, the subject matter of which is hereby incorporated by reference.

2. Description of the Related Art

In conventional synchronous memory devices, an input buffer receives an externally transmitted input signal and stores the input signal in accordance with an internal clock signal generated in synchronization with a reference clock.

FIG. 1 is a timing diagram illustrating operation of a conventional memory device. FIG. 1 shows a number of input signals routinely applied to conventional memory devices, including a clock signal (CLK), a chip selection signal (/CS), a row address strobe signal (/RAS), a column address strobe signal (/CAS), a write enable signal (/WE), and address signals (ADDRs). Also in FIG. 1, the period "ts" denotes a setup time period and "th" denotes a hold time period for the various input signals.

In the example illustrated in FIG. 1, setup time "ts" for the respective input signals is a period of time during which each input signal is provided at a defined point of circuitry (e.g., a buffer, latch, flip-flop, etc.) in advance of CLK signal transition (e.g., a transition from low to high at time t1 in the illustrated example). The hold time "th" for the respective input signals is a period of time during which the logical state (a logical "high" or "low") is maintained following transition of the CLK signal at time t1.

Referring to FIG. 1, the setup time "ts" and the hold time "th" for all of the various input signals are determined in relation to the indicated CLK signal transition at time t1. However, this approach to input signal provision may become problematic problems when the CLK signal is run at high frequency (i.e., transitions rapidly). As the period of the CLK signal decreases with rising frequency, the time available for setup and hold periods becomes increasing limited. Unfortunately, emerging synchronous memory devices are characterized in many instances by an increasing operating speed rate and correspondingly high clock frequencies.

Of additional note, conventional synchronous memory devices are also characterized by a number of different operating modes. These operating modes generally include a power down mode adapted to conserve power consumption and a normal operating (i.e., a non-power down) mode in which operational commands are executed.

Table 1 is a truth table showing selected and commonly used commands (e.g., stand-by, activation, read, write, precharge, and power down) in the context of non-power down and power down operating modes. The state of selected input signals are also illustrated in the context of the commands.

TABLE 1

| Mode | Command | CKE | /CS | /RAS | /CAS | /WE | ADDR |
|---|---|---|---|---|---|---|---|
| Non-Power Down | Stand-by | H | H | X | X | X | X |
| | Activation | H | L | L | L | H | H/L |
| | READ | H | L | H | H | H | H/L |
| | WRITE | H | L | H | H | L | H/L |
| | Precharge | H | L | L | H | L | X |
| Power down | Power down | L | X | X | X | X | X |

In Table 1, H denotes a logically "high" signal state, L denotes a logically "low" signal state, and X denotes a "don't care" state.

FIG. 2 is a block diagram of an input signal portion 200 of a conventional memory device. As shown, input signal portion 200 includes a plurality of input buffers 210 through 270, and a plurality of latch circuits 230-1 through 270-1.

That is, input signal portion 200 of the conventional memory device includes a clock enable (CKE) buffer 210 which receives the CKE signal, a clock (CLK) buffer 220 which receives the CLK signal, a chip selection (CS) buffer 230 which receives the CS signal, a row address strobe (/RAS) buffer 240 which receives the /RAS signal, a column address strobe (/CAS) buffer 250 which receives the /CAS signal, a write enable (/WE) buffer 260 which receives the /WE signal, and an address (ADDR) buffer 270 which receives the ADDR signal.

Input buffers 220 through 270 are enabled and disabled under control of an internal clock enable signal PCKE output by CKE buffer 210.

Input signal portion 200 further includes latch circuits 230-1, 240-1, 250-1, 260-1 and 270-1, as shown in FIG. 2. Latch circuits 230-1 through 270-1 latch the output signals from input buffers 230 through 270, respectively, in response to an internal clock signal PCLK output by CLK buffer 220.

In power down mode (see Table 1), input buffers 220 through 270 are disabled in response to a first logic level of the internal clock enable signal PCKE output by CKE buffer 210 (which remains enabled). In this manner, power consumption otherwise expended by input buffers 220 through 270 is reduced in power down mode. On the other hand, in non-power down mode, input buffers 220 through 270 are enabled in response to a second logic level of the internal clock enable signal PCKE output by CKE buffer 210.

In the context of this exemplary circuitry, and recognizing the difficulty of maintaining adequate setup and hold times for the input signals as the CLK signal increases in frequency, it is generally necessary to continuously enabled of input buffers 220 through 270 in the normal (non-power down) operating mode in order to stably store the various input signals as internal signals in latch circuits 230-1 through 270-1. The power consumed in the normal (non-power down) operating mode by the input buffers is not insignificant, especially when the memory device is utilized in a portable device requiring minimal power consumption. Such portable devices include, as examples, personal digital assistants (PDA), notebook computers, mobile communication devices, and so on.

SUMMARY OF THE INVENTION

In one embodiment, the invention provides an input buffer for a memory device enabled and disabled in response to a chip selection signal and a power down signal indicative of power down information.

In a related embodiment, the input buffer is enabled when both the power down signal indicates a non-power down mode, and the chip selection signal indicates a chip selection state, and is disabled when either the power down signal indicates a power down mode or the chip selection signal indicates a non-chip selection state.

In another related embodiment, the input buffer comprises at least buffer selected from a group consisting of a row address strobe input buffer, a column address strobe input buffer, a write enable buffer, and an address input buffer.

In another embodiment, the invention provides a memory device, comprising; a clock buffer adapted to receive a clock signal having periodically occurring first and second CLK signal type transitions, a first input buffer adapted to receive a chip selection signal and having a setup time and hold time defined in relation to a first CLK signal type transition occurring a first time, and at least one second input buffer adapted to receive at least an input signal, other than the chip selection signal, and having a setup time and hold time defined in relation to a second CLK signal type transition at a second time.

In another embodiment, the invention provides a memory controller, comprising; circuitry adapted to generate a clock signal having periodically occurring first and second CLK signal type transitions, circuitry adapted to generate a chip selection signal having a setup time and hold time defined in relation to a first CLK signal type transition occurring a first time, and circuitry adapted to generate at least one input signal, other than the chip selection signal, and having a setup time and hold time defined in relation to a second CLK signal type transition at a second time.

In another embodiment, the invention provides a memory system, comprising; a memory controller adapted to generate predetermined input signals in relation to a clock signal, the clock signal having periodically occurring first and second CLK signal type transitions, and a memory adapted to perform memory operations in response to the input signals, wherein the input signals comprise a chip selection signal having a setup time and hold time defined in relation to a first CLK signal type transition occurring a first time, and at least one other input signal having a setup time and hold time defined in relation to a second CLK signal type transition at a second time.

DESCRIPTION OF EMBODIMENTS

Figure 1:
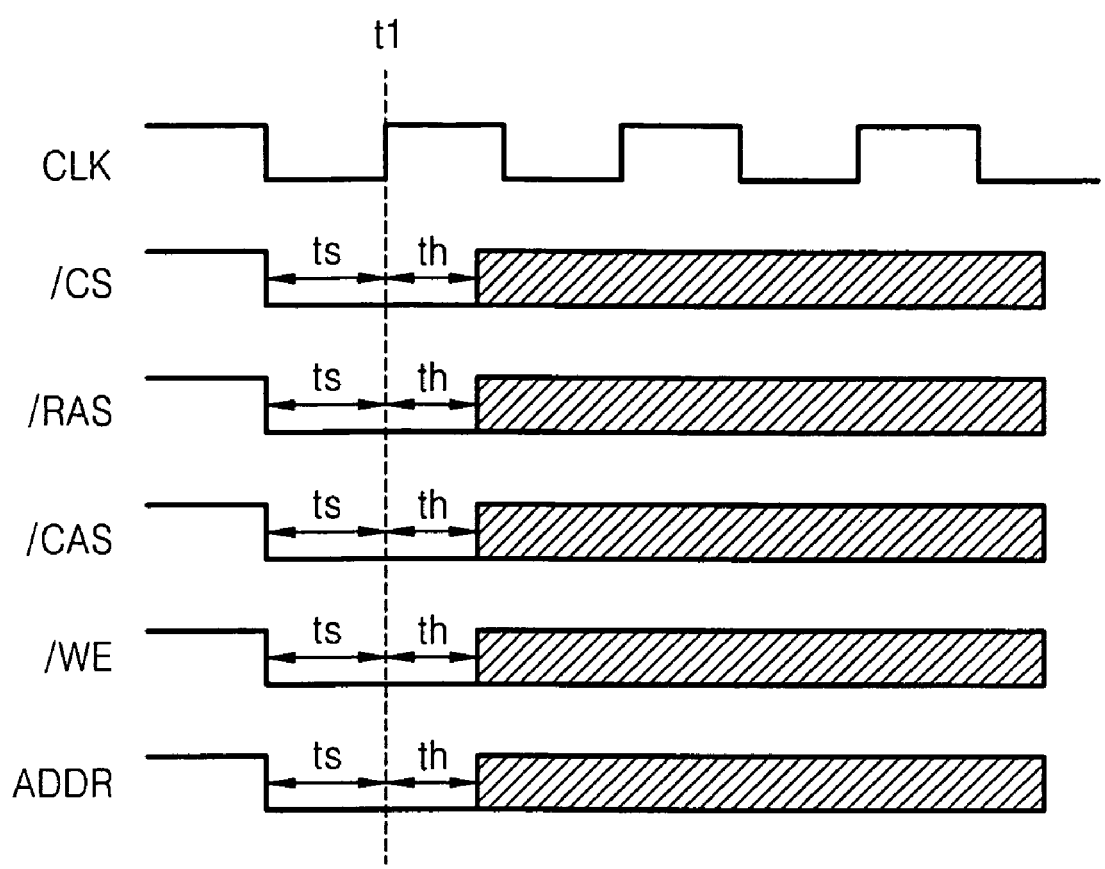
FIG. 1 is a timing diagram of input signals in a conventional memory device.
Figure 2:
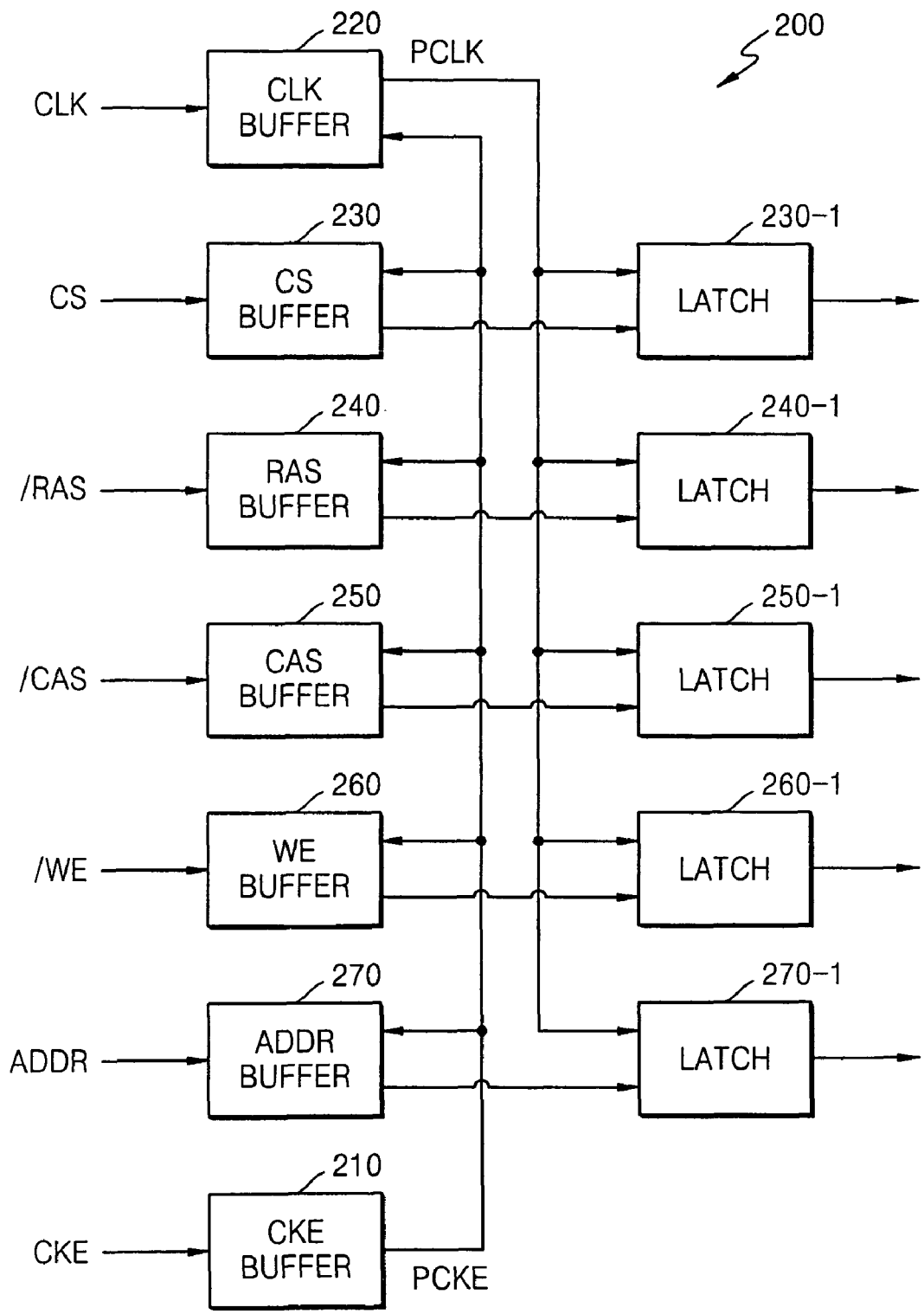
FIG. 2 is a block diagram of an input portion of a conventional memory device.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, like reference numerals denote like or similar elements.

Figure 3:
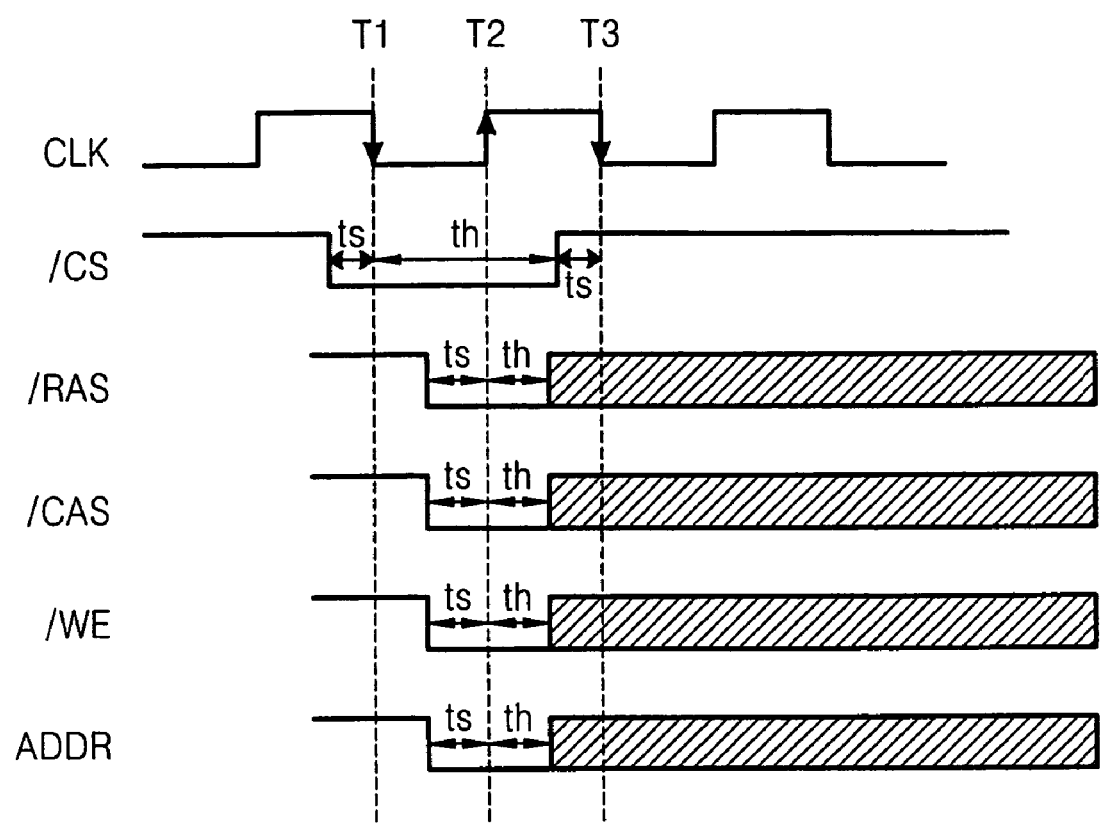
FIG. 3 is a timing diagram of input signals according to an embodiment of the present invention.

FIG. 3 is a timing diagram illustrating operation of a memory device according to an embodiment of the invention. FIG. 3 illustrates various input signals to the memory device in relation to a clock (CLK) signal. The exemplary input signals include; a chip selection signal (/CS), a row address strobe signal (/RAS), a column address strobe signal (/CAS), a write enable signal (/WE), and an address signal (ADDR). As in FIG. 1, the term "ts" denotes a signal setup time and "th" denotes a signal hold time for each input signals /CS, /RAS, /CAS, /WE and ADDR. Note here that setup and hold times for input signal /CS differ from those of input signals /RAS, /CAS, /WE and ADDR.

That is, in the example illustrated in FIG. 3, setup time "ts" and hold time "th" for the chip selection (/CS) signal are defined in relation to first type of clock signal (CLK) transition (e.g., a clock (CLK) signal transition from high to low) at a first time T1. In contrast, the setup and hold times for the other input signals (a row address strobe (/RAS) signal, a column address strobe (/CAS) signal, a write enable (/WE) signal, and an address (ADDR) signal) are defined in relation to a second type of clock signal (CLK) transition (e.g., a clock (CLK) signal transition from low to high) at a second time T2 subsequent to time T1.

In this manner, the chip selection (/CS) signal is setup (i.e., established in a stable state) at the first CLK transition type occurring at time T1, and this state is maintained through a hold time period extending beyond the second time period T2 at which a second CLK transition type occurs.

Figure 4:
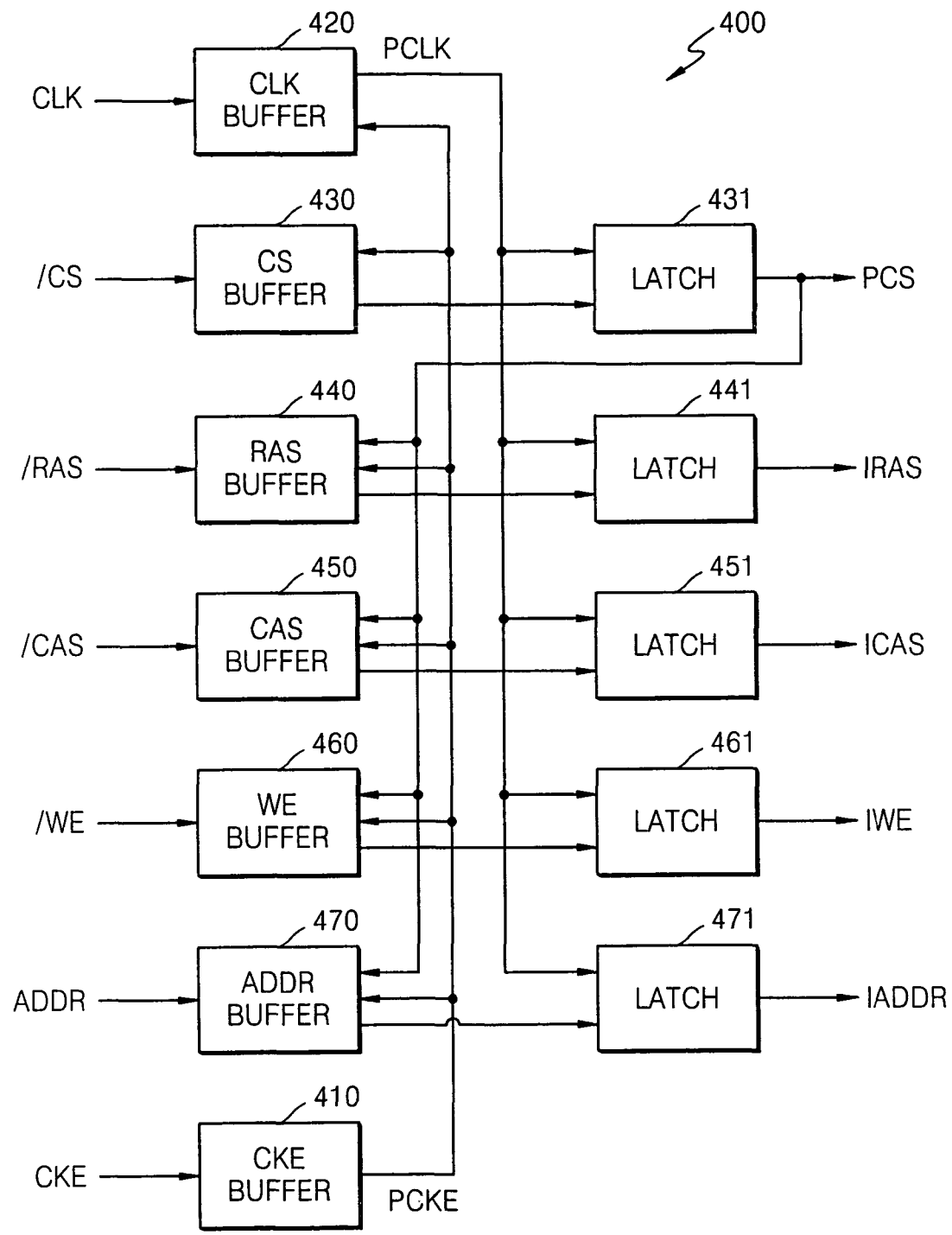
FIG. 4 is a block diagram of an input portion of a memory device according to an embodiment of the present invention.

FIG. 4 illustrates an input signal portion 400 of a memory device according to an embodiment of the present invention.

Referring to FIG. 4, input signal portion 400 includes a clock enable (CKE) buffer 410 which receives the CKE input signal, a CLK buffer 420 which receives the CLK signal, a /CS buffer 430 which receives the /CS input signal, a /RAS buffer 440 which receives the /RAS input signal, a /CAS buffer 450 which receives the /CAS input signal, a /WE buffer 460 which receives the /WE input signal, and an address buffer 470 which receives the ADDR input signal. In addition, input signal portion 400 includes latch circuits 431, 441, 451 and 471 respectively connected to corresponding outputs of /CS buffer 430, /RAS buffer 440, /CAS buffer 450, /WE buffer 460, and address buffer 470.

To simplify FIG. 4, only a single ADDR buffer 470 is illustrated. However, in practical implementations input signal portion 400 will include a plurality of ADDR buffers 470.

CKE buffer 410 outputs an internal clock enable (PCKE) signal in response to the CKE signal to buffers 420 to 470. During a power down mode, the operation of buffers 420 to 470 is disabled by the PCKE signal.

CLK buffer 420 receives the CLK signal in order to generate a PCLK signal and commonly supply the PCLK signal to each of latch circuits 431 to 471.

/CS buffer 430 receives the /CS signal and transmits the /CS signal to a first latch circuit 431. First latch circuit 431 latches an internal chip selection (PCS) signal in response to the PCLK signal generated in response to a first CLK signal type transition.

The PCS signal is commonly transmitted to /RAS buffer 440, /CAS buffer 450, /WE buffer 460, and address buffer 470. The operational states of /RAS buffer 440, /CAS buffer 450, /WE buffer 460, and address buffer 470 are determined in response to both the PCKE signal and the PCS signal.

In other words, /RAS buffer 440, /CAS buffer 450, /WE buffer 460, and address buffer 470 are enabled or disabled in response to both the PCKE signal, containing power down indication, and the PCS signal containing a chip selection state.

Second to fifth latch circuits 441 to 471 store output signals from corresponding buffers 440 to 470 as internal signals in response to the PCLK signal generated in response to a second CLK signal type transition.

Figure 5A:
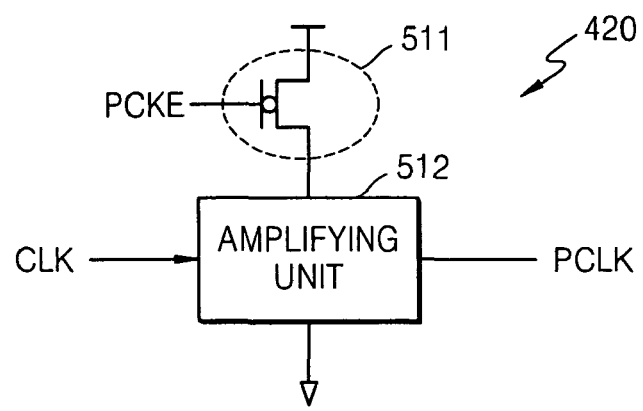
FIGS. 5A, 5B, and 5C are circuit diagrams of input buffers shown in FIG. 4 according to embodiments of the present invention.

FIG. 5A is a circuit diagram further illustrating CLK buffer 420 of FIG. 4 according to an embodiment of the present invention.

CLK buffer 420 in the example of FIG. 5A includes an enabling unit 511 and an amplifying unit 512. Enabling unit 511 functions as a switch, which selectively enables or disables amplifying unit 512 based on a logic level of the PCKE signal (received from CKE buffer 410) indicative of power down information. In this example, enabling unit 511 is a PMOS transistor which is turned ON and OFF in response to the PCKE signal.

Amplifying unit 512 receives the CLK input signal, the periodic transitions of which correspondingly generate internal clock PCLK signal. For example, referring to FIG. 3, the first CLK signal type transitions at times T1 and T3 may be to a low level state, while the second CLK signal type transition at time T2 may be to a high level state. For purposes of explanation herein, the PCLK signal comprises first logic type PCLK signal portions occurring in response to first CLK signal type transitions, and second logic level PCLK signal portions occurring in response to second CLK signal type transitions.

Figure 5B:
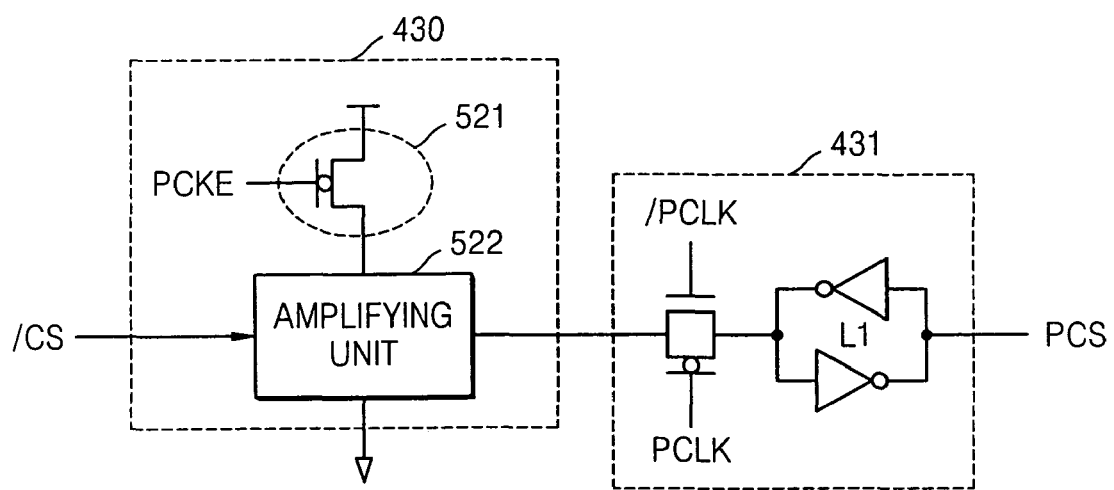

FIG. 5B is a circuit diagram further illustrating /CS buffer 430 and latch circuit 431 of FIG. 4 according to an embodiment of the present invention.

/CS buffer 430 in the example of FIG. 5B includes an enabling unit 521 and an amplifying unit 522. In FIG. 5B, latch circuit 431 shown in FIG. 4 is also included. Enabling unit 521 functions as a switch which enables or disables the operation of amplifying unit 522 based on the logic level of the PCKE signal containing power down information. Enabling unit 521 is a transistor which is turned ON and OFF in response to the PCKE signal.

Amplifying unit 522 receives the /CS signal and transmits the received /CS signal to latch circuit 431 when enabling unit 521 is turned ON. Latch circuit 421 includes a switch S1 and a latch L1.

Switch S1 is turned ON in response to a low transition of the PCLK signal and stores a PCS signal in latch L1. Here, setup and hold times for the /CS signal are defined in relation to the first CLK signal type transition at time T1.

Figure 5C:
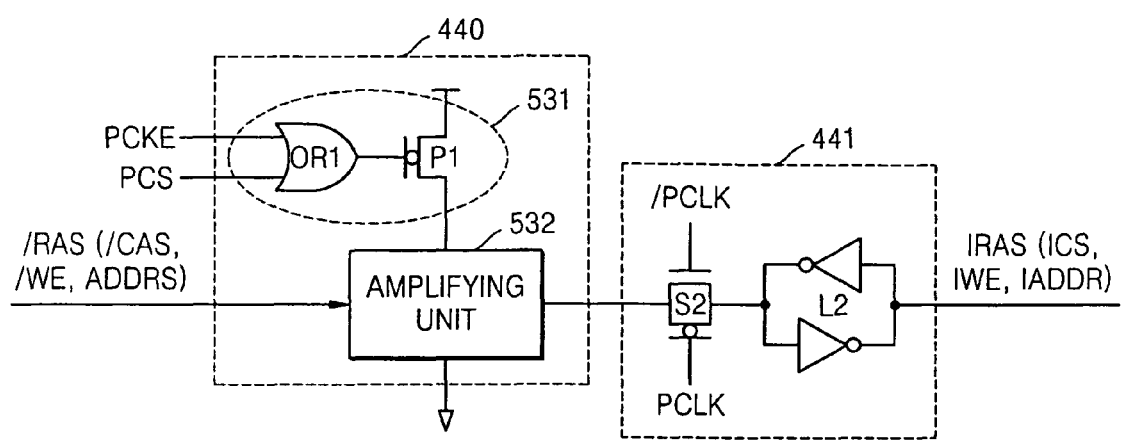

FIG. 5C is a circuit diagram further illustrating /RAS buffer 440 latch circuit 441 of FIG. 4 according to an embodiment of the present invention. /CAS buffer 250 and latch circuit 250-1, /WE buffer 260 and latch circuit 260-1, and ADDR buffer 270 and latch circuit 270-1 may be similarly configured. Accordingly, FIG. 5C also illustrates the input signals and internal signals of these input buffer and latch circuits.

/RAS buffer 440 of the example of FIG. 5C includes an enabling unit 531 and an amplifying unit 532. In FIG. 5C, latch circuit 441 shown in FIG. 4 is also included. Enabling unit 531 includes logic device OR1 receiving a PCKE signal and a PCS signal, and a switch P1 receiving the output of logic device OR1.

Logic device OR1 enables a switch P1 only when the PCKE signal is logically low, that is, when a logical low indicates a non-power down mode of operation, and when a logical low for the PCS signal indicates the chip selection (/CS) state.

Amplifying unit 532 receives a /RAS signal only when switch P1 is turned ON, and transmits the received /RAS signal to latch circuit 441. Latch circuit 441 includes a switch S2 and a latch L2. Switch S2 stores the received /RAS signal in latch L2 as an internal signal PRAS in response to a second type transition of the PCLK signal.

In FIG. 5C, only /RAS buffer 440 is illustrated and described for convenience of description, but the /CAS buffer 450, /WE buffer 460, and/or ADDR buffer 470 may have the same structure.

Hereinafter, operation of a memory device designed in accordance with the dictates of the foregoing embodiments will be described with reference to Table 1 and FIGS. 3, 4 and 5.

First, a low CKE signal is received and in response, the PCKE signal goes high during a power down operating mode. When the PCKE signal goes high, the respective enabling units for buffers 420 to 470, excluding CKE buffer 410, are turned OFF, thereby disabling operation of buffers 420 to 470. As such, during the power down mode, the power consumption of buffers 420 to 470 are minimized.

Then, a high CKE signal is received, and in response the PCKE signal goes low during a standby state of the non-power down operating mode. When the PCKE signal goes low, CKE buffer 410, and enabling unit 511 or 521 of /CS buffer 430 are turned ON, thereby enabling operation of CKE buffer 410, and the enabling unit 511 or 521 of /CS buffer 430.

CLK buffer 410 then outputs the PCLK signal to buffers 430 to 470. /CS buffer 430 receives a high /CS signal and latch circuit 431 stores a high PCS signal during a first type transition of the PCLK signal.

Accordingly, switches P1 of /RAS buffer 440, /CAS buffer 450, /WE buffer 460, and address buffer 470 are turned OFF by logic device OR1 of the enabling unit, thereby disabling operation of /RAS buffer 440, /CAS buffer 450, /WE buffer 460, and address buffer 470.

As shown in FIG. 3, when commands are received during a non-power down mode, the /CS signal, having previously established a setup state in response to a first CLK signal type transition at time T1, maintains a corresponding hold time through time T2.

In latch circuit 431 of the /CS signal, switch S1 is turned ON during the first CLK signal type transition at time T1 by the corresponding low transition of the PCLK signal, and latch L1 stores a low PCS signal.

The low PCS signal together with a low PCKE signal are input to logic device OR1 of enabling unit 531 of /RAS buffer 440, /CAS buffer 450, /WE buffer 460, and address buffer 470 in order to turn ON switch P1. Accordingly, the amplifying units of buffers 440 to 470 start to operate.

At this time, as shown in FIG. 3, /RAS buffer 440, /CAS buffer 450, /WE buffer 460, and address buffer 470 store signals, determining setup time ts and hold time th, in the latches which correspond to internal signals, in response to the high transition of the PCLK signal in response to the second CLK signal type transition at time T2.

Also, as the /CS signal goes high at time T3, the PCS signal goes high. Accordingly, enabling units of /RAS buffer 440, /CAS buffer 450, /WE buffer 460, and address buffer 470 are turned OFF, thereby disabling operation of buffers 440 to 470.

Thus, operation of the buffers is enabled for only a minimum period of time, in which input signals required for memory operation are received, thereby minimizing power consumption related to the buffers. For this, operation of other buffers is controlled in response to the /CS signal a half clock faster than is conventional which is differently applied than the other input signals which respond to the PCS signal.

Figure 6:
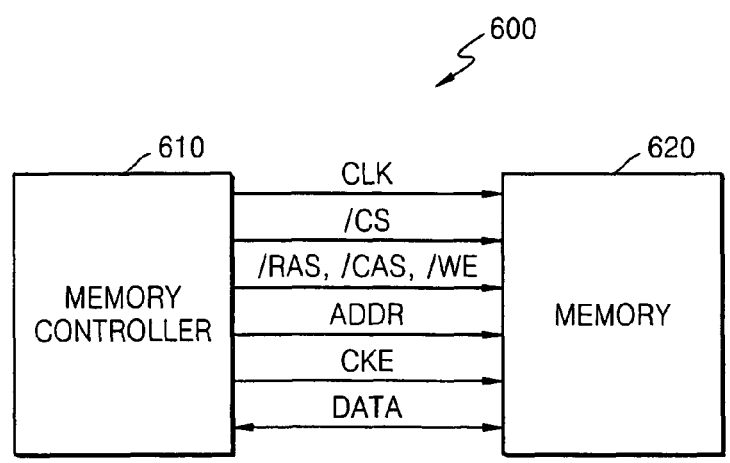
FIG. 6 is a block diagram illustrating a memory system according to an embodiment of the present invention.

FIG. 6 is a block diagram illustrating a memory system according to an embodiment of the present invention.

Referring to FIG. 6, a memory system 600 includes a memory controller 610 and a memory 620. Memory controller 610 transmits a CLK signal, together with predetermined signals (a /CS signal, a /RAS signal, a /CAS signal, a /WE signal, a CKE signal) and ADDR signals to memory 620.

Memory 620 includes input buffers (not shown) each receiving the /CS signal, the /RAS signal, the /CAS signal, the /WC signal, the CKE signal, and the address signals. Setup time ts and hold time th for the chip selection signal (/CS) are defined in response to a first CLK signal type transition at a first time T1 and is transmitted to memory 620.

Setup time ts and hold time th for each of the of the input signals (e.g., /RAS signal, /CAS signal, and /WC signal), as well as address signals are defined in relation to a second CLK signal type transition at a following second time T2, and are transmitted to memory 620. In one embodiment, the first CLK type transition goes from high to low and the second CLK type transition is the opposite. Thus, in memory controller 610, the /CS signal is transmitted to memory 620 a half a clock cycle faster than the other input signals.

Memory 620 stores the /CS signal as received on the first CLK signal type transition, and accordingly determines operation for the input buffers receiving the other input signals and address signals using an internal signal corresponding to the /CS signal.

Also, memory 620 may determine the operation of input buffers receiving the chip selection signal (/CS) and the other input signals (including the address signals) using an internal signal that corresponds to the chips selection signal (/CS) and a power down signal (e.g., CKE signal) containing power down information.

A memory device employing the input buffer according to the present invention can minimize power consumption of a command input buffer and an address input buffer even within a standby state of a non-power down mode. Accordingly, a memory device having overall lower power consumption may be implemented. Also, using this type of memory device, a memory system having reduced power consumption may be implemented.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. An input buffer for a memory device, the input buffer being configured to receive a chip selection signal indicating either a chip selection state or a non-chip selection state, and a power down signal indicating either a power down mode or a non-power down mode of operation for the memory device, wherein the input buffer is enabled and disabled in response to the chip selection signal and the power down signal indicative of power down information.

2. The input buffer of claim 1, wherein the input buffer is enabled when the power down signal indicates the non-power down mode, and the chip selection signal indicates the chip selection state.

3. The input buffer of claim 2, wherein the input buffer is disabled when either the power down signal indicates the power down mode or the chip selection signal indicates the non-chip selection state.

4. The input buffer of claim 3, wherein the input buffer comprises at least one buffer selected from a group consisting of a row address strobe input buffer, a column address strobe input buffer, a write enable buffer, and an address input buffer.

5. A memory device, comprising:
a clock buffer configured adapted to receive a clock signal having periodically occurring first and second CLK signal type transitions;
a first input buffer configured to receive a chip selection signal and having a setup time and hold time defined in relation to a first CLK signal type transition occurring at a first time; and
at least one second input buffer configured to receive at least an input signal, other than the chip selection signal, and having a setup time and hold time defined in relation to a second CLK signal type transition occurring at a second time.

6. The memory device of claim 5, wherein the first time is ahead of the second time.

7. The memory device of claim 6, wherein the first input buffer stores the chip selection signal as a first internal signal in response to the first CLK signal type transition at the first time, and the second input buffer is enabled in response to the first internal signal to receive the input signal.

8. The memory device of claim 7, wherein the input signal is at least one signal selected from a group consisting of a row address strobe (/RAS) signal, a column address strobe (/CAS) signal, a write enable (/WE) signal, and an address signal.

9. The memory device of claim 8, further comprising:
a third input buffer configured to receive a power down signal indicating power down information.

10. The memory device of claim 9, wherein the first input buffer is enabled and disabled in response to the power down signal.

11. The memory device of claim 10, wherein the second input buffer is enabled in response to a combination of the first internal signal and the power down signal.

12. A memory controller, comprising:
circuitry configured to generate a clock signal having periodically occurring first and second CLK signal type transitions;
circuitry configured to generate a chip selection signal having a setup time and hold time defined in relation to a first CLK signal type transition occurring at a first time; and
circuitry configured to generate at least one input signal, other than the chip selection signal, and having a setup time and hold time defined in relation to a second CLK signal type transition occurring at a second time.

13. The memory controller of claim 12, wherein the first time is ahead of the second time.

14. The memory controller of claim 13, wherein the input signal comprises at least one signal selected from a group consisting of a row address strobe (/RAS) signal, a column address strobe (/CAS) signal, a write enable (/WE) signal, and an address signal.

15. The memory controller of claim 14, further comprising:
circuitry configured to generate a power down signal.

16. A memory system, comprising:
a memory controller configured to generate predetermined input signals in relation to a clock signal, the clock signal having periodically occurring first and second CLK signal type transitions; and
a memory configured to perform memory operations in response to the input signals, wherein the input signals comprise a chip selection signal having a setup time and hold time defined in relation to a first CLK signal type transition occurring at a first time, and at least one other input signal having a setup time and hold time defined in relation to a second CLK signal type transition occurring at a second time.

17. The memory system of claim 16, wherein the first time is ahead of the second time.

18. The memory system of claim 17, wherein the memory comprises:
   a first input buffer configured to receive the chip selection signal; and
   at least one additional input buffer configured to receive the at least one other input signal.

19. The memory system of claim 18, wherein the one other input signal comprises at least one signal selected from a group consisting of a row address strobe (/RAS) signal, a column address strobe (/CAS) signal, a write enable (/WE) signal, and an address signal.

20. The memory system of claim 19, wherein the memory further comprises:
   a third input buffer configured to receive a power down signal.

21. The memory system of claim 20, wherein the at least one additional input buffer is enabled and disabled in response to the power down signal.

22. The memory system of claim 20, wherein the second input buffer is enabled in response to both the first internal signal and the third signal.

* * * * *